(12) United States Patent
Berg et al.

(10) Patent No.: US 10,594,134 B2
(45) Date of Patent: Mar. 17, 2020

(54) DISTRIBUTION SYSTEM WITH AN ELECTRONIC FUSE TERMINAL AND AT LEAST ONE FIRST SERIES TERMINAL

(71) Applicant: PHOENIX CONTACT GMBH & CO. KG, Blomberg (DE)

(72) Inventors: Peter Berg, Schlangen (DE);
Alexander Fomenko, Bielefeld (DE);
Guido Nahles, Bad Lippspringe (DE);
Martin Wetter, Detmold (DE);
Christian Juergenhake, Rieterg (DE);
Peter Ketler, Detmold (DE); Carsten Plattmann, Paderborn (DE); Timo Bessler, Blomberg (DE)

(73) Assignee: PHOENIX CONTACT GMBH & CO. KG (DE)

( * ) Notice: Subject to any disclaimer, the term of this patent is extended or adjusted under 35 U.S.C. 154(b) by 225 days.

(21) Appl. No.: 15/359,230

(22) Filed: Nov. 22, 2016

(65) Prior Publication Data

US 2017/0149239 A1 May 25, 2017

(30) Foreign Application Priority Data

Nov. 23, 2015 (DE) .................... 20 2015 106 368 U

(51) Int. Cl.
*H02H 9/02* (2006.01)
*H02H 3/08* (2006.01)
(Continued)

(52) U.S. Cl.
CPC ............. *H02H 9/02* (2013.01); *G08B 21/185* (2013.01); *H01R 9/2691* (2013.01); *H02B 1/00* (2013.01); *H02H 3/08* (2013.01); *H05K 7/1475* (2013.01)

(58) Field of Classification Search
CPC .......... G08B 21/185; H02H 9/02; H02H 3/08; H01H 85/22; H01R 9/2691; H02B 1/00; H05K 7/1475
(Continued)

(56) References Cited

U.S. PATENT DOCUMENTS

| | | | | |
|---|---|---|---|---|
| 4,394,639 A | * | 7/1983 | McGalliard | .......... H01H 85/046 337/292 |
| 4,958,426 A | * | 9/1990 | Endo | .................. H01H 85/0417 219/121.12 |

(Continued)

FOREIGN PATENT DOCUMENTS

| | | |
|---|---|---|
| DE | 100 24 560 A1 | 11/2001 |
| DE | 10 2014 218 646 A1 | 3/2015 |

(Continued)

*Primary Examiner* — Zeev V Kitov
(74) *Attorney, Agent, or Firm* — Sheridan Ross P.C.

(57) ABSTRACT

The object of the invention is a distribution system with an electronic fuse terminal and at least one first series terminal, wherein the electronic fuse terminal and the at least one first series terminal are arranged immediately adjacent to one another on a mounting rail, and wherein the electronic fuse terminal and the at least one first series terminal each have at least one adjacent bridging member, wherein the electronic fuse terminal can be supplied with input voltage, with the electronic fuse terminal making at least one protected first output potential available, and wherein the protected first output potential is forwarded to the first series terminal by means of a first bridging plug to the first series terminal.

12 Claims, 3 Drawing Sheets

(51) Int. Cl.
*H01R 9/26* (2006.01)
*G08B 21/18* (2006.01)
*H02B 1/00* (2006.01)
*H05K 7/14* (2006.01)

(58) Field of Classification Search
USPC .......................................................... 361/93
See application file for complete search history.

(56) References Cited

U.S. PATENT DOCUMENTS

| | | | | |
|---|---|---|---|---|
| 7,561,017 | B2 * | 7/2009 | Darr | H01H 9/104 |
| | | | | 337/143 |
| 10,001,526 | B2 * | 6/2018 | Salas | G01R 31/327 |
| 2002/0122289 | A1 * | 9/2002 | Meiners | H01H 85/47 |
| | | | | 361/676 |
| 2003/0184984 | A1 * | 10/2003 | Onizuka | H05K 7/026 |
| | | | | 361/760 |
| 2007/0091547 | A1 * | 4/2007 | Murakami | H01H 85/044 |
| | | | | 361/627 |

FOREIGN PATENT DOCUMENTS

| | | |
|---|---|---|
| DE | 10 2014 105 316 A1 | 10/2015 |
| DE | 10 2014 213 728 A1 | 1/2016 |

* cited by examiner

DISTRIBUTION SYSTEM WITH AN ELECTRONIC FUSE TERMINAL AND AT LEAST ONE FIRST SERIES TERMINAL

This application claims the benefit of German Patent Application No. DE 20 2015 106 368.7 filed Nov. 23, 2015, the entire contents of which are incorporated herein by reference.

The invention relates to a distribution system with an electronic fuse terminal and at least one first series terminal.

Electronic fuses are already known from the prior art.

Various systems are known for mounting supporting rails.

For one, there are so-called 1-channel solutions, which provide one potential protected at one connection, and for another there are multichannel solutions, which provide several potentials protected at different connections.

However, these solutions are not capable of providing one protected potential or several protected potentials for a plurality of consumers in an industrial context while offering a space-saving and cost-effective construction.

It is the object of the invention to provide an improved and cost-effective distribution system with an electronic fuse terminal that avoids one or more of the drawbacks of the prior art.

The object is achieved according to the invention by the features of the independent claim. Advantageous embodiments of the invention are indicated in the subclaims.

In the following, the invention is explained in further detail with reference to the enclosed drawing on the basis of preferred embodiments.

Figure 1:
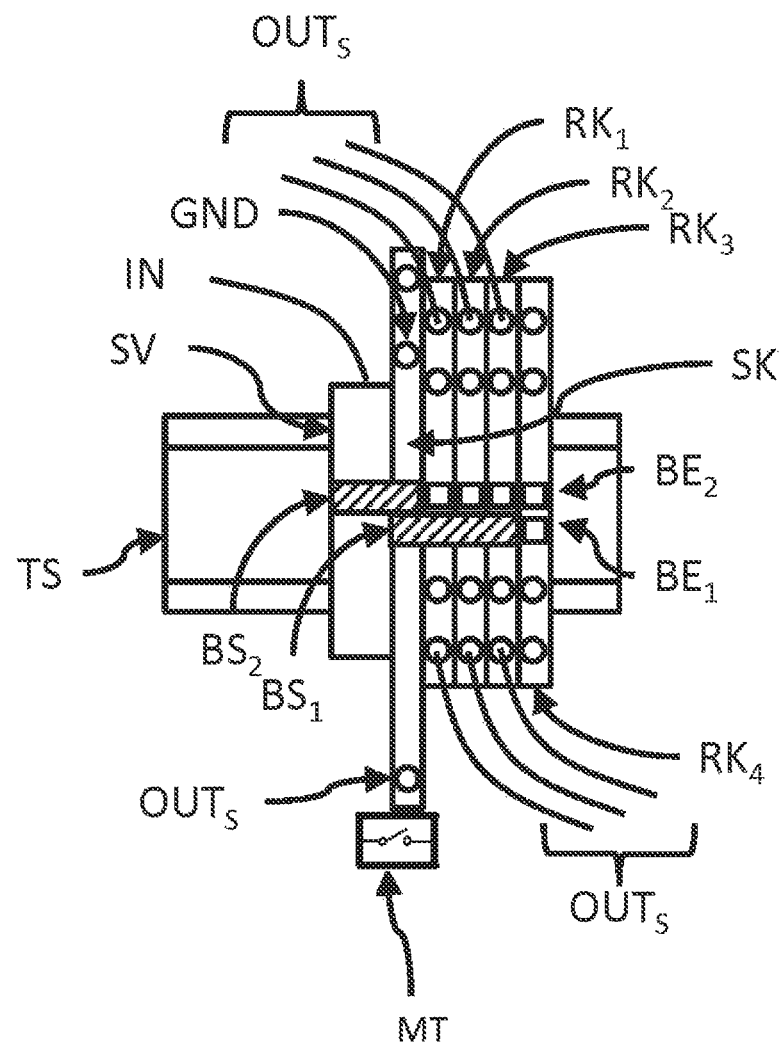
Figure 2:
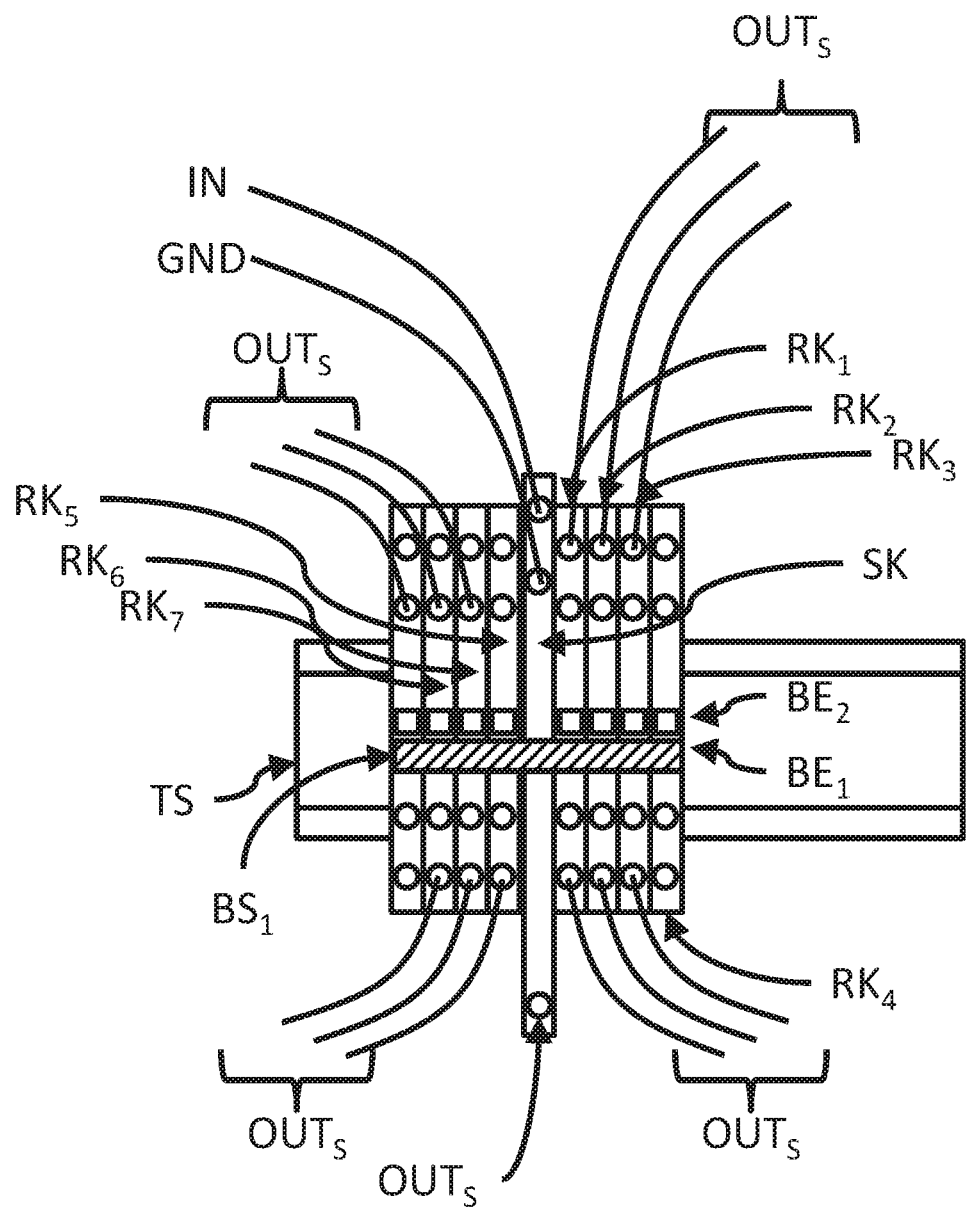
Figure 3:
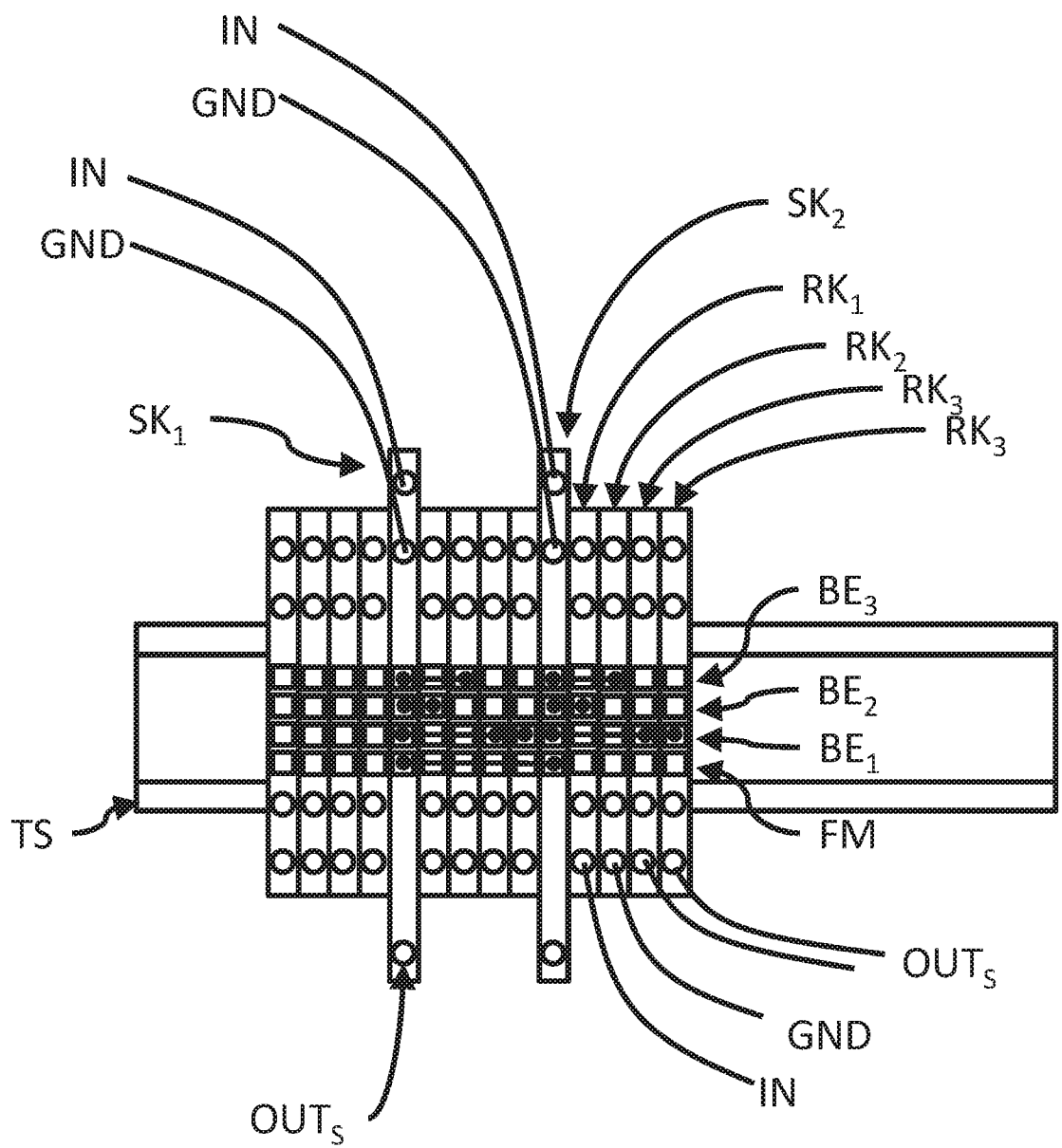

FIG. 1 shows a first schematic diagram according to embodiments of the invention, FIG. 2 shows a second schematic diagram according to embodiments of the invention, and FIG. 3 shows a third schematic diagram according to embodiments of the invention.

The invention is explained in further detail below with reference to the figure. It should be noted that different aspects are described, each of which can be utilized individually or in combination. That is, any aspect can be used with different embodiments of the invention, provided that it is not portrayed explicitly as a mere alternative.

Moreover, for the sake of simplicity, reference will as a rule always be made in the following to only one entity. Insofar as not noted explicitly, however, the invention can also have several of the entities concerned. Therefore, the use of the words "a," "an," "of a" and "of an" is to be understood only as an indication to the effect that at least one entity is used in a single embodiment.

In the description that follows, reference is made to the figures. As a rule, same or similar elements are designated by same or similar reference symbols.

One exemplary distribution system according to the invention is shown in FIG. 1.

The distribution system has at least one electronic fuse terminal $SK_1$. The invention is not limited to this, however; rather, it can also be used with 2 or more electronic fuse terminals $SK_2$, as can be seen from FIG. 3, for example.

Furthermore, the exemplary distribution system according to the invention has at least one first series terminal $RK_1$.

Series terminals are provided for the purpose of making potentials available to a plurality of consumers. For this purpose, series terminals have adjoining bridging members (on bridging planes) which serve to distribute potentials between the series terminals, for example. Some series terminals also have one or more connections on one or more planes to which the respective potential made available via the bridge can be fed to the consumers.

The electronic fuse terminal $SK_1$ and the at least one series terminal $RK_1$ are arranged immediately adjacent to one another on a mounting rail TS. The mounting rail can be a profile rail, for example a top-hat rail or a G-rail, made of a suitable material. One example of such a mounting rail TS is the so-called DIN rail.

The electronic fuse terminal $SK_1$ and the at least one first series terminal $RK_1$ each have at least one adjacent bridging member. FIGS. 1 and 2 show an example with two bridging members, with the bridging members being arranged on bridging planes $BE_1$ and $BE_2$. FIG. 3 shows an example with four bridging members on bridging planes $BE_1$ to $BE_4$.

In FIG. 1, the electronic fuse terminal $SK_1$ is supplied with an input voltage IN indirectly via a power supply terminal SV, which is also arranged on the mounting rail TS, via a second bridging plug $BS_2$.

In FIGS. 2 and 3, by contrast, the input voltage IN is connected directly to the electronic fuse terminal $SK_1$. That is, the inventive system being presented is extremely flexible and enables high-capacity power sources to be connected via the power supply terminal SV, for example. For example, the connection of the power supply terminal SV can offer a greater conductor cross section than the electronic fuse terminal $SK_1$.

Insofar as potentials are described in the following which suggest the use of direct-current voltage, it should be noted that the invention is not limited to this.

The electronic fuse terminal $SK_1$ makes at least one protected first output potential $OUT_s$ available.

The protected first output potential $OUT_s$ is forwarded by means of a first bridging plug $BS_1$ to the first series terminal $RK_1$.

According to one aspect of the invention, it is also possible for the system to also make a second output potential GND, IN available to a second bridging member that is different from the first output potential $OUT_s$. For example, it is shown in FIG. 3 that the electronic fuse terminal $SK_2$ forwards the (unprotected) input potential to the series terminal $RK_1$ on the bridging plane $BE_2$, whereas a ground potential GND is forwarded to the series terminal $RK_2$ on the bridging plane $BE_3$ and the protected output potential $OUT_s$ is forwarded on the bridging plane $BE_1$. That is, if the bridging members are designed appropriately, different potentials—both protected and unprotected—can be distributed.

While the ground potential GND can be fed by means of a junction to the electronic fuse terminal as shown in the figures, it would also be possible as an alternative or in addition to make a ground potential available by means of a metallic mounting rail TS, in which case an electrical contact would be established with the mounting rail upon placement of the electronic fuse terminal, for example by means of metallic fastening elements.

The system can of course also have at least one second series terminal, with the second series terminal also having at least one adjacent bridging member, and with the electronic fuse terminal $SK_1$ and the second series terminal being arranged immediately adjacent to one another on the mounting rail TS.

As shown in FIG. 2, the protected first output potential $OUT_s$ can be forwarded by means of the first bridging plug $BS_1$ to the second series terminal $RK_5$ and/or by means of a second bridging plug (not shown) to the second series terminal $RK_5$.

For example, it can prove necessary to set up parallel connections using several bridging plugs in order to carry a given level of current, for instance.

In other words, in FIG. 2 the protected output potential $OUT_s$ is distributed both to the series terminals $RK_{5...7}$ to the left of the electronic fuse terminal $SK_1$ and to the series terminals $RK_{1...4}$ to the right of the electronic fuse terminal $SK_1$.

On the other hand, however, it is also possible to distribute different (protected and/or unprotected) potentials to the right and to the left, as can be readily seen from a comparison of the teachings of FIG. 2 and FIG. 3.

Especially advantageously, a provision can also be made that the electronic fuse terminal $SK_1$ makes a remote signal FM available. This remote signal can also be used as an aggregate remote signal, as shown in FIG. 3. In larger circuits, for example, a remote signal can thus be made available to a service technician, thereby rendering the circuit in question easier to locate.

Alternatively or in addition, an acoustic and/or optical alarm device for local fault reporting can be made available—for example, a (red) light-emitting diode or an acoustic signal transmitter—in order to enable a faulty or overloaded electronic fuse terminal to be quickly located. Alternatively or in addition, an (additional) operation display—using a green LED, for example—can also be enabled.

It is especially advantageous for the electronic fuse terminal $SK_1$ to have a width of less than 7 mm, particularly 6.2 mm, thus enabling it to be inserted into preferred grid dimensions of the applicant's series terminal systems.

Also advantageously, a triggering current value can be permanently preset in the electronic fuse terminal $SK_1$. It is also possible, however, for this current value to be selectable during production and/or during installation. In this way, individual needs can be better addressed while simultaneously reducing costs, since the current value can now be set so as to fit any device and any situation.

Particularly, a provision can be made that the maximum current of the protected output potential ($OUT_s$) is limited to a preset value (e.g., 6 A), or that, when a certain value is reached or exceeded, it is switched off either immediately or with a delay.

In addition, a provision can be made that the electronic fuse terminal SK has a manual trigger MT for the fuse function as shown in FIG. 1. This can be an advantageous safeguard during assembly or maintenance work, for example.

That is, it is now possible with the invention to connect a larger number of consumers.

What is more, the invention makes it possible to connect a larger number of consumers in a space-saving manner.

LIST OF REFERENCE SYMBOLS

Series terminal $RK_{1...N}$
Electronic fuse terminal $SK_1$, $SK_2$
Mounting rail TS
Input voltage IN
First output potential $OUT_S$
Bridging plug $BS_1$, $BS_2$
Remote signal FM
Power supply terminal SV
Bridging plane $BE_{1...4}$

What is claimed is:

1. A distribution system:
an electronic terminal;
a first series terminal for making potentials available to consumers, wherein the first series terminal is arranged immediately adjacent to the electronic terminal on a mounting rail; and
at least one second series terminal,
wherein the electronic terminal has a first bridging member,
wherein the electronic terminal receives an input voltage and makes a protected first output potential available to the first series terminal, the protected first output potential being different from the input voltage,
wherein the protected first output potential is forwarded from the electronic terminal to the first series terminal by means of the first bridging member and a first bridging plug,
wherein the at least one second series terminal has at least one adjacent second bridging member, wherein the electronic terminal and the at least one second series terminal are arranged immediately adjacent to one another on the mounting rail, and
wherein the protected first output potential is forwarded by means of the first bridging plug to the at least one second series terminal or by means of a second bridging plug to the at least one second series terminal.

2. A distribution system:
an electronic terminal;
a first series terminal for making potentials available to consumers, wherein the first series terminal is arranged immediately adjacent to the electronic terminal on a mounting rail; and
at least one second series terminal,
wherein the electronic terminal has a first bridging member,
wherein the electronic terminal receives an input voltage and makes a protected first output potential available to the first series terminal, the protected first output potential being different from the input voltage,
wherein the protected first output potential is forwarded from the electronic terminal to the first series terminal by means of the first bridging member and a first bridging plug,
wherein the electronic terminal and the at least one second series terminal are arranged immediately adjacent to one another on the mounting rail,
wherein the electronic terminal makes at least one protected second output potential available, and
wherein the protected second output potential is forwarded by means of a second bridging plug from the electronic terminal to the at least one second series terminal.

3. The distribution system as set forth in claim 1, wherein the electronic terminal makes a remote signal available.

4. The distribution system as set forth in claim 1, wherein the electronic terminal makes an alarm device for local fault reporting available.

5. The distribution system as set forth in claim 1, wherein the electronic terminal has a width of less than 7 mm.

6. The distribution system as set forth in claim 1, wherein the electronic terminal has a permanently preset triggering current value.

7. The distribution system as set forth in claim 1, wherein the electronic terminal limits the current of the first protected output potential to a preset value, wherein the electronic terminal is switched off immediately or with a delay when a certain current value is reached or exceeded.

8. The distribution system as set forth in claim 1, wherein the electronic terminal has a manual trigger for a fuse function.

9. The distribution system as set forth in claim 1, further comprising:
   a third series terminal; and
   a third bridging member,
   wherein the electronic terminal forwards a ground potential to the third series terminal via the third bridging member and a third bridging plug.

10. The distribution system as set forth in claim 9, wherein the first and second bridging members extend in a first direction, and wherein the electronic terminal, the first series terminal, and the at least one second series terminal, and the third series terminal extend in a second direction perpendicular to the first direction.

11. The distribution system as set forth in claim 1, wherein the first series terminal and the electronic terminal extend in a first direction and are parallel to one another.

12. The distribution system as set forth in claim 11, wherein the first bridging member extends in a second direction perpendicular to the first direction.

* * * * *